United States Patent [19]

Swapp

[11] Patent Number: 4,943,787

[45] Date of Patent: Jul. 24, 1990

[54] DIGITAL TIME BASE GENERATOR WITH ADJUSTABLE DELAY BETWEEN TWO OUTPUTS

[75] Inventor: Mavin C. Swapp, Mesa, Ariz.

[73] Assignee: Motorola, Inc., Schaumburg, Ill.

[21] Appl. No.: 403,271

[22] Filed: Sep. 5, 1989

[51] Int. Cl.$^5$ .......................... H03K 5/15; H03L 7/07
[52] U.S. Cl. ........................................ 331/2; 328/29; 328/55; 328/62; 331/25; 331/45
[58] Field of Search ................. 331/2, 25, 45; 328/29, 328/55, 62

[56] References Cited

U.S. PATENT DOCUMENTS 3,961,269 6/1976 Alvarez, Jr. ..................... 331/45 X
4,847,516 7/1989 Fujita et al. ..................... 328/55 X Primary Examiner—Siegfried H. Grimm
Attorney, Agent, or Firm—Joe E. Barbee; Stuart T. Langley

[57] ABSTRACT

A digital time base generator circuit is provided having a first phase locked loop for multiplying a reference frequency by an integer amount and a second phase locked loop for multiplying the reference frequency by a different integer amount. The first and second multiplied reference frequencies are then divided back down to the original reference frequency by two dual modulus frequency dividers. In this manner a start signal and a stop signal are generated such that the frequency of the start and stop reference signals is the same as the original reference frequency and the time delay between an edge of the start signal and edge of the stop signal can be changed by altering the mode of either of the dual modulus frequency dividers.

15 Claims, 2 Drawing Sheets

DIGITAL TIME BASE GENERATOR WITH ADJUSTABLE DELAY BETWEEN TWO OUTPUTS

BACKGROUND OF THE INVENTION

This invention relates in general to time base generator circuits, and particularly to circuits which produce digital timing signals used for calibrating time measurement systems.

Digital time base generator circuits are circuits which produce a signal having pulse edges separated by a known relationship in time, hereinafter called a time reference signal. Time base generator circuits are also known as timing signal generators or time standards. To calibrate a time measurement system precisely, a time base generator circuit should produce a signal having a period which is the same length or smaller than the minimum time period to be measured. Circuits which produce a signal in the range of one Hz, for example, are commonly used in watches and clocks, where one second is the minimum time period to be measured.

The manufacture and use of electronic circuits requires that parameters such as switching speeds and gate delay times are measured accurately. Commonly, time measurement circuits are used to measure these parameters. Time measurement circuits produce an output that is proportional to the amount of time that passes between two events, usually between two pulses on a signal line. Calibration of these time measurement systems involves inputting a signal with a known time delay and comparing the measurement systems output with the known time delay. Usually the input signal comprises a start signal and stop signal wherein an edge of the start signal triggers the time measurement system to begin measuring time and an edge of the stop signal triggers the time measurement system to stop. The separation, or delay, between the edges of the start and stop signal must be extremely accurate in order to calibrate the time measurement circuits. Because switching speed and gate delay time of some circuits is in the order of picoseconds (ps), it is necessary for the time measurement system to be precise in the range of just a few picoseconds.

In the past, circuits which produced a timing signal, or a pair of timing signals to be used as the start and stop signal described above, comprised an oscillator which generated a reference signal which was then split between a first and a second transmission line. The first transmission line was coupled directly to the time measurement system and provided the start signal. The second transmission line comprised a mechanical delay line of a known time delay $\Delta t$. A signal traveling through the second transmission line, therefore, took longer to reach the end of the second transmission line than did the signal traveling through the first transmission line. Thus, in theory, the signals on the first and second transmission lines would be identical except out of phase by a known time delay $\Delta t$ which was determined by the length of the mechanical delay time. The signal on the first transmission line could be used as a start signal and the signal on the second transmission line could be used as a stop signal.

Circuits using mechanical delay lines are quite bulky since even a short delay requires several feet of transmission line. Such circuits are not compatible with portable equipment, and cannot be built into a piece of equipment without increasing the size and cost of the equipment. Thus, time base generators were usually external to a piece of equipment, such as a tester, and were used only occasionally to calibrate the equipment. Time base circuits which were small enough to be built into equipment lacked the precision for many applications.

The time base generator circuit described above resulted in standing waves on the first and second transmission lines caused by reflected energy which occurs at the termination of the transmission lines. The amplitude of the standing wave was a function of the frequency of oscillation on the transmission line and the characteristics of the transmission line termination. The standing wave interfered constructively or destructively with the signal on the transmission lines depending on the frequency of the standing wave and the length of the transmission lines. These effects became more pronounced as higher frequencies were transmitted on the transmission lines. Thus, the output received from the first and second transmission lines was dependent on the reference frequency and the length of the transmission lines.

To be useful for calibration purposes, a time reference circuit must be adjustable over some range of time periods so that various time reference signals can be applied to the time measurement system during calibration. In order to vary the time reference signal of the circuits described hereinbefore, two methods were commonly used. First, the oscillation frequency could be varied to change the period of the reference signal as well as the time delay between start and stop edges. Unfortunately, however, the standing waves were generated on the first and second transmission lines even when the transmission lines were properly terminated, and resulted in noise on the transmission lines which reduced the integrity of the time base signal. Because the first and second transmission lines were different lengths, the standing wave noise effected the start and stop signals differently. Because of this, the noise modified the time reference signal and appeared to the time measurement system as an increase or decrease in time delay of the time reference signal. Thus, to be truly accurate, the time reference circuit would itself have to be calibrated very carefully at each oscillator frequency before being used to calibrate a time measurement system. Since the amplitude of the standing wave increased at higher frequencies, the noise problem was particularly acute when time reference signals less than a few nanoseconds were needed.

Another method of using the above described time reference circuit is to use an adjustable mechanical delay line so that variable time delays can be generated. Variable mechanical delay lines are merely transmission lines wherein the length of the transmission line can be changed by manually expanding or contracting the delay line. Thus, the length of the second transmission line can be increased or decreased to change the relative position of the start and stop edges produced by the time reference circuit. Although this arrangement allowed the use of a single oscillator frequency which eliminated standing wave variation due to oscillator frequency, changing the length of the transmission line added a new noise component to the time base generator. The amplitude of a standing wave varies along the length of a transmission line so that as the mechanical delay line was increased in size the effect of the standing wave on the output time reference signal changed. This change was seen by the time measurement system as a change in reference time.

It should be understood that while the time base circuit described hereinbefore is adequate for relatively long time periods, it becomes difficult to use for sub-nanosecond time periods.

Accordingly, it is an object of the present invention to provide a time reference circuit which can provide various time references without changing reference frequency on the signal line.

It is another object of the present invention to provide a time reference circuit without a mechanical delay line.

It is a further object of the present invention to provide a time reference circuit which is compact and can be easily incorporated into a piece of equipment.

It is a further object of the present invention to provide a time reference circuit with improved precision.

It is still another object of the present invention to provide a time reference circuit which is easily programmable.

SUMMARY OF THE INVENTION

These and other objects of the present invention are achieved by providing a digital time base generator circuit having a first phase locked loop for multiplying a reference frequency by an integer amount and a second phase locked loop for multiplying the reference frequency by a different integer amount. This provides first and second multiplied reference frequencies which are then divided back down to the original reference frequency by two dual modulus frequency dividers. In this manner a start signal and a stop signal are generated such that the frequency of the start and stop reference signals is the same as the original reference frequency and the time delay between an edge of the start signal and an edge of the stop signal can be changed by altering the mode of either or both of the dual modulus frequency dividers.

DETAILED DESCRIPTION OF DRAWINGS

Figure 1:
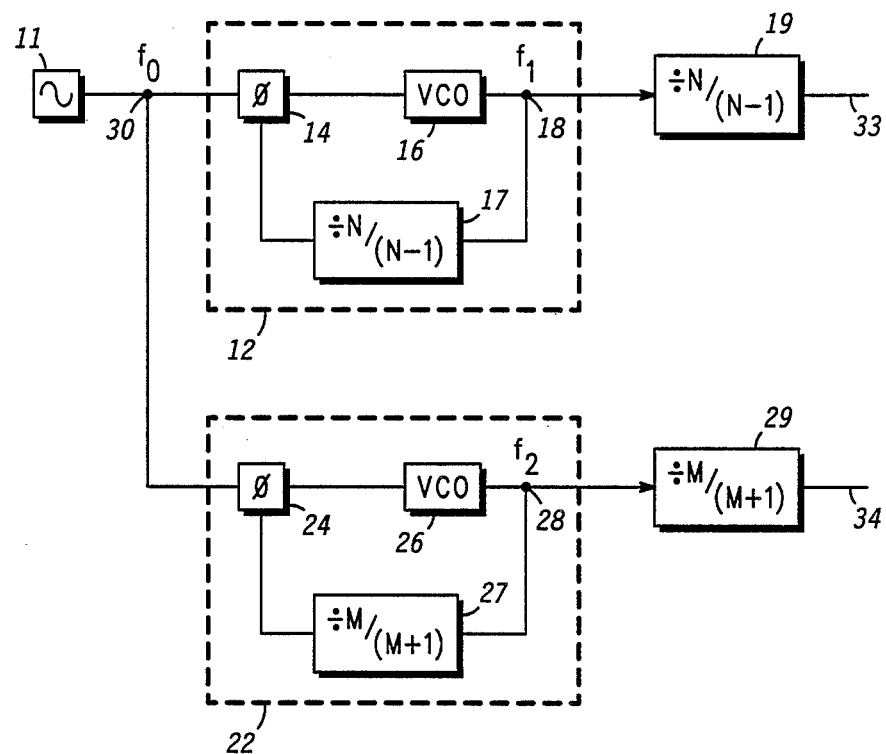
FIG. 1 illustrates a block diagram of a time reference circuit of the present invention.

FIG. 1 illustrates a block diagram of a time reference circuit of the present invention. Oscillator 11 provides a reference frequency whose operation frequency $f_0$ is chosen to determine the precision of the final reference signal, as will be seen. Oscillator 11 usually comprises a crystal oscillator and in a preferred embodiment operates at 7,570,252 Hz. The accuracy of crystal oscillator 11 will eventually determine the accuracy of the output timing signal, so it is desirable to choose a crystal oscillator having an accuracy of at least 1 part/million (ppm).

Oscillator 11 is coupled by transmission lines to phase locked loops 12 and 22. Phase locked loop 12 comprises phase detector 14, voltage control oscillator (VCO) 16, and frequency divider 17 coupled in a negative feedback loop between the output of VCO 16 and phase detector 14. Frequency divider 17 serves to divide an input frequency on node 18 by an integer amount N and feedback the divided frequency to phase detector 14. Phase detector 14 outputs a voltage to VCO 16 which is a function of a phase or frequency mismatch between reference frequency $f_0$ and the output of frequency divider 17. The voltage output of phase detector 14 causes VCO 16 to increase or decrease its output frequency until the frequencies which are input to phase detector 14 are matched. Because frequency divider 17 is in a negative feedback loop, the frequency $f_0$ at node 30 is multiplied by an integer multiple N which is determined by frequency divider 17.

Optionally, frequency divider 17 may be a dual modulus frequency divider which can be made to divide the frequency by $N-1$ for one cycle. The use of this optional function will be described hereinafter. Frequency divider 17 is a commercially available circuit which is also referred to as a two-modulus prescaler or a dual modulus counter. One such device is part number MC12022 sold by Motorola, Inc.

A frequency $f_1 = (N)(f_0)$ is thus generated at node 18 which is then coupled to frequency divider 19. In normal operation, frequency divider 19 reduces the frequency by the same factor N as frequency divider 17. Thus, the output frequency at output 33 is the same as the reference frequency $f_0$ at node 30.

Phase locked loop 22 comprises phase detector 24, VCO 26, and frequency divider 27. Operation of phase locked loop 22 is analogous to that of phase locked loop 12 except that frequency divider 27 divides the frequency on node 28 by an integer M instead of N. Alternatively, frequency divider 27 can divide the frequency by $M+1$. Frequency $f_2$ on node 28 is thus an integer multiple M of the frequency $f_0$ on node 30. Frequency $f_2$ generated by phase locked loop 22 is coupled to dual modulus frequency divider 29 which divides the frequency by M, or alternatively $M+1$. In normal operation, frequency divider 29 divides the frequency $f_2$ on node 28 by the same integer factor as frequency divider 27, so that output frequency on node 34 is the same as the reference frequency $f_0$ on node 30.

Output 33 is typically coupled to a start input of an external time measurement unit and node 34 is coupled to the stop input of the time measurement unit, although it should be understood that start and stop signals are interchangeable as it is the difference between the start and stop pulse edges that is used to calibrate the time measurement unit. It should be noted that both outputs 33 and 34 operate at the same frequency thus, even if standing waves are generated in the circuit, the effect of the standing waves will be the same on both start and stop signals, and thus will not be seen by the time measurement system as a change in reference time.

Figure 2:
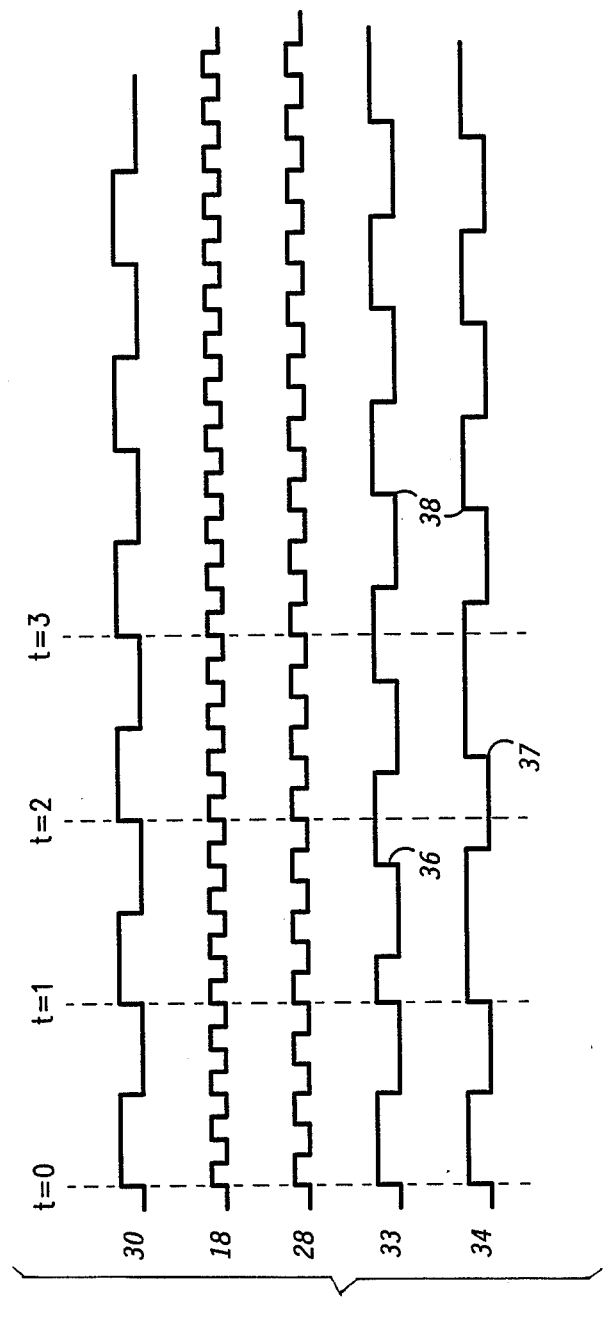
FIG. 2 illustrates a timing signal diagram of timing signals generated at various nodes and outputs shown in FIG. 1.

The operation of the circuit shown in FIG. 1 can be understood by looking at the timing diagram shown in FIG. 2. Waveforms 30, 18, 28, 33, and 34 represent the frequencies and relative edge positioning of signals at the nodes and outputs shown in FIG. 1 bearing the same designation. For ease of description, the timing shown in FIG. 2 is for $N=4$ and $M=3$ although much larger numbers of M and N are more practical. In a preferred embodiment $N=129$ and $M=128$ so that all of the frequency dividers 17, 19, 27, and 29 as shown in FIG. 1 can be similar part types. Node 30 is the output of oscillator 11 and has a frequency of 1 cycle per time period. As will be seen, higher frequencies at node 30 result in greater precision of the output timing signal and so any frequency may be chosen for $f_0$ depending on the desired precision. Node 18 has a frequency $f_1 = (N)(f_0)$, or as illustrated in FIG. 2, $f_1 = 4$ cycles per time period. Node 28 has a frequency $f_2 = (M)(f_0)$, or as illustrated in FIG. 2, $f_2=3$ cycles per time period. In a preferred embodiment, the output of oscillator 11 is 7,570,252 Hz, $f_1$ will be 976,562,508 Hz and $f_2$ will be 968,992,256 Hz.

Outputs 33 and 34 illustrate first and second output signals after being divided by dual modulus frequency dividers 19 and 29 respectively. In normal operation, frequency divider 19 divides the frequency at node 18 so that output frequency at output 33 is the same as oscillator frequency $f_0$ at node 30. In a second mode, frequency divider 19 divides the frequency by $N-1$, as shown in the period between $T=1$ and $T=2$ in FIG. 2. Shifting frequency divider 19 to the second mode for one cycle of oscillator 11 results in an output waveform on output 33 having a frequency $f_0$, but whose rising and falling edges are shifted in time by $1/f_1$. More generally, frequency divider 19 may be of a type that instead of dividing by $N-1$, divides by some other frequency N-X. In this case, the rising and falling edges seen on output 33 will be shifted in time by $X/f_1$. It should also be noted that greater time shifts can be achieved by holding frequency divider 19 in the second mode for more than one cycle of oscillator 11, in which case a shift of $X/f_1$ occurs for each cycle of oscillator 11 in which frequency divider 19 is held in the second mode.

Similarly, when frequency divider 29 is made to divide by $M+1$ instead of M for $M-1$ cycles, as shown between $T=1$ and $T=3$, the output frequency on output 34 is again $f_0$, but the rising and falling edges are shifted by $1/f_2$. By phase shifting the signals on outputs 33 and 34 in this manner, it can be seen that the edges of waveforms 33 and 34 indicated at 38 are separated by an amount equal to $$\left[\frac{1}{f_2} - \frac{1}{f_1}\right].$$

When frequency dividers 19 and 29 are replaced in the normal mode of operation, the output frequency on outputs 33 and 34 will remain $f_0$, and the relative difference between rising and falling edges will remain at $$\left[\frac{1}{f_2} - \frac{1}{f_1}\right].$$

Since $f_1=(N)(f_0)$, and $f_2=(M)(f_0)$, the time difference between the rising edges shown at 38 can be expressed as $$\Delta t = \frac{1}{(N)(M)(f_0)}.$$

When $f_0=7,570,252$ and $N=129$ and $M=128$, $\Delta t$ will equal approximately 8 ps. Thus the circuit will output start and stop pulses which are separated by 8 picoseconds, with an accuracy which is the same as the accuracy of crystal oscillator 11, preferably one part per million. To produce larger time reference signals the steps described above can be repeated, each time placing frequency divider 19 in the $N-1$ mode for one cycle of oscillator 11 and placing frequency divider 29 in the $M+1$ mode for $M-1$ cycles of oscillator 11. Each repetition of these steps causes the edges of waveforms on outputs 33 and 34 to be separated by an additional 8 picoseconds.

Frequency divider 17 in PLL 12 and frequency divider 27 in PLL 22 may also be dual modulus prescalers, that is to say each of the frequency dividers 17 and 27 may have a first and second operating mode. In this case, the second mode of each of the prescalers can be used to shift the time separation $\Delta t$ between start and stop pulses at outputs 33 and 34 in a similar manner to that described in reference to frequency dividers 19 and 29. Since frequency divider 17 is coupled in the negative feedback loop, shifting to the second mode of operation results in a shift which is equal in magnitude but opposite in direction of the time shift caused by operating frequency divider 19 in the second mode as described hereinbefore. Likewise, operating frequency divider 27 in the second mode results in an equal but opposite shift to that caused by operating frequency divider 29 in the second mode.

This added ability to quickly increase or decrease the magnitude of $\Delta t$ may be useful in some calibration applications, however, since frequency dividers 17 and 27 are coupled in feedback loops of PLLs 12 and 22 respectively, it will take a finite amount of time for the PLLs to stabilize after the feedback loop is perturbed. This finite amount of time may be so long that it may be more advantageous to leave frequency dividers 17 and 22 in the first mode of operation, and use only frequency dividers 19 and 29 to produce time shift $\Delta t$.

The minimum time base which can be generated is thus $$\Delta t = \frac{1}{(N)(M)(f_0)},$$

while the maximum time base which can be generated is $1/f_0$, limited by the reference frequency $f_0$. The circuit shown in FIG. 1 can thus produce an output time base signal having any value from $\Delta t=8$ ps to $\Delta t=132,096$ ps in 8 picoseconds increments. It should be noted that this circuit provides a time reference without the use of a calibrated delayed line which greatly reduces the size, weight, and cost of the circuit. In its most basic form the circuit described hereinbefore takes up only a few square inches of space and can be easily integrated into a piece of equipment to make the equipment self-calibrating. The time base generator circuit provided offers a stable and adjustable time reference source which is easily made as accurate as one part per million using a conventional crystal oscillator.

I claim:

1. A circuit for producing a first and a second reference signal which are out of phase by a time $\Delta t$ comprising: an oscillator having a frequency $f_0$ output; a first phase locked loop (PLL) coupled to the oscillator output and producing an output frequency $f_1$; a first dual modulus counter coupled to an output of the first PLL and producing the first reference signal having a frequency equal to the frequency $f_0$, a second PLL coupled to the oscillator output and producing an output frequency $f_2$; and a second dual modulus counter coupled to an output of the second PLL and producing the second reference signal having a frequency equal to the frequency $f_0$, wherein the first and second reference signals are separated by a time $\Delta t$.

2. The circuit of claim 1 wherein the oscillator is a crystal oscillator.

3. The circuit of claim 1 wherein the first dual modulus counter normally divides by $(N+1)$ and can optionally divide by N, where N is an integer, and the second dual modulus counter normally divides by N and can optionally divide by (N+1).

4. The circuit of claim 3 wherein the ratio of $f_1:f_0$ is (N+1) and the ratio of $f_2:f_0$ is N.

5. The circuit of claim 3 wherein N is 128.

6. The circuit of claim 3 wherein the minimum time $\Delta t$ which can be generated is approximately $$\Delta t = \frac{1}{(N)(N+1)(f_0)}.$$

7. A method for producing two reference signals of the same frequency which are out of phase by a fixed time separation $\Delta t$ comprising the steps of: providing a frequency $f_0$; multiplying $f_0$ by a first integer N to produce a frequency $f_1$; multiplying $f_0$ by a second integer M to produce a frequency $f_2$; dividing $f_1$ by N to produce the first reference signal; dividing $f_2$ by M to produce the second reference signal; dividing $f_1$ by an integer other than N for at least one cycle of the first reference signal and/or dividing $f_2$ by an integer other than M for at least one cycle, thereby shifting the first reference signal with respect to the second reference signal by $\Delta t$.

8. The method of claim 7 wherein the integer other than N is N−1, thereby shifting the first reference signal with respect to the second reference signal by $$\Delta t = \frac{1}{f_1}.$$

9. The method of claim 7 wherein the integer other than M is M+1, and $f_2$ is divided by M+1 for M−1 cycles of the second reference signal, thereby shifting the second reference signal with respect to the first reference signal by $$\Delta t = \frac{1}{f_2}.$$

10. The method of claim 7 wherein the integer other than N is N−1 and the integer other than M is M+1, wherein $f_1$ is divided by N−1 for one cycle of the first reference signal and $f_2$ is divided by M+1 for M−1 cycles of the second reference frequency, thereby shifting the relative position of the first reference signal with respect to the second reference signal by $$\Delta t = \frac{1}{(M)(N)(f_0)}.$$

11. A circuit for generating a programmable time reference signal having a start pulse and a stop pulse, the circuit comprising: a first phase locked loop for receiving a reference frequency $f_0$ and generating a frequency $f_1$ which is an integer multiple N times $f_0$; a second phase locked loop for receiving the reference frequeny $f_0$ and generating a frequency $f_2$ which is another integer multiple M times $f_0$; a first programmable frequency divider means for dividing $f_1$ by N or N−1 and generating the start pulse of the time reference signal; a second programmable frequency divider means for dividing $f_2$ by M or M+1 and generating the stop pulse of the time reference signal.

12. The circuit of claim 11 wherein $f_0$ is approximately 7,570,252 Hz.

13. The circuit of claim 11 wherein N is 129 and M is 128.

14. The circuit of claim 11 wherein the first phase locked loop is programmable and can output a frequency which is (N−1) times $f_0$, and the second phase locked loop is programmable and can output a frequency which is (M+1) times $f_0$.

15. The circuit of claim 11 further comprising a crystal oscillator for generating $f_0$.

* * * * *